(12) United States Patent
Chiang et al.

(10) Patent No.: US 10,863,278 B2
(45) Date of Patent: Dec. 8, 2020

(54) BLUETOOTH HEADSET COMBINED WITH ANTENNA AND TOUCH SENSOR

(71) Applicant: HOLY STONE ENTERPRISE CO., LTD., Taipei (TW)

(72) Inventors: Chiu-Lin Chiang, Taipei (TW); Chang-Ching Lin, Taipei (TW); Chih-Chung Lin, Taipei (TW)

(73) Assignee: Holy Stone Enterprise Co., Ltd., Taipei (TW)

( * ) Notice: Subject to any disclaimer, the term of this patent is extended or adjusted under 35 U.S.C. 154(b) by 0 days.

(21) Appl. No.: 16/529,321

(22) Filed: Aug. 1, 2019

(65) Prior Publication Data
US 2020/0045422 A1 Feb. 6, 2020

(30) Foreign Application Priority Data

Aug. 2, 2018 (TW) .............................. 107210605 U

(51) Int. Cl.
| | | |
|---|---|---|
| *H04R 5/033* | (2006.01) | |
| *H04R 5/04* | (2006.01) | |
| *H03K 17/96* | (2006.01) | |
| *H04W 4/80* | (2018.01) | |
| *H04R 1/10* | (2006.01) | |

(52) U.S. Cl.
CPC .......... *H04R 5/033* (2013.01); *H03K 17/962* (2013.01); *H04R 1/1041* (2013.01); *H04R 5/04* (2013.01); *H04W 4/80* (2018.02); *H04R 2420/07* (2013.01)

(58) Field of Classification Search
CPC ........ H04R 5/033; H04R 1/1041; H04R 5/04; H04R 2420/07; H04W 4/80; H03K 17/962

USPC ......................................................... 381/370
See application file for complete search history.

(56) References Cited

U.S. PATENT DOCUMENTS

| | | | | |
|---|---|---|---|---|
| 9,992,316 B2* | 6/2018 | Hardi | ................... | G11B 27/105 |
| 2008/0268912 A1* | 10/2008 | Wang | .................. | H04M 1/6066 455/569.1 |
| 2009/0285437 A1* | 11/2009 | Takigawa | ............. | H04R 1/1041 381/380 |

(Continued)

FOREIGN PATENT DOCUMENTS

| | | | | |
|---|---|---|---|---|
| CN | 204887344 U | * | 12/2015 | |
| CN | 107293841 A | * | 10/2017 | ........... G06F 3/0443 |

*Primary Examiner* — Sean H Nguyen
(74) *Attorney, Agent, or Firm* — Muncy, Geissler, Olds & Lowe, P.C.

(57) ABSTRACT

A Bluetooth headset combined with antenna and touch sensor, which integrates a sensing touch member inside a button of the Bluetooth headset with a Bluetooth antenna. The antenna element with touch function increases the density of the earphone component, in addition to the waterproof improvement, and the Bluetooth antenna is set near the external position of the Bluetooth headset, which makes the audio signal transmission effect clearer. Further, a first touch matching circuit, a second touch matching circuit and a changeover switch are electrically connected between the antenna element and the touch sensing module. When the signal of the antenna element is blocked, the changeover switch automatically switches between the first touch matching circuit and the second touch matching circuit to perform frequency adjustment and selects the better signal of the first or second touch matching circuit to do a circuit matching.

10 Claims, 4 Drawing Sheets

(56) References Cited

U.S. PATENT DOCUMENTS

| | | | |
|---|---|---|---|
| 2015/0381609 A1* | 12/2015 | Dadu | G06F 21/32 |
| | | | 726/9 |
| 2018/0048953 A1* | 2/2018 | Park | G06F 3/162 |
| 2019/0046794 A1* | 2/2019 | Goodall | A61B 5/04004 |
| 2020/0204899 A1* | 6/2020 | Moudgill | H04R 1/1016 |

* cited by examiner

BLUETOOTH HEADSET COMBINED WITH ANTENNA AND TOUCH SENSOR

This application claims the priority benefit of Taiwan patent application number 107210605, filed on Aug. 2, 2018.

BACKGROUND OF THE INVENTION

1. Field of the Invention

The present invention relates to multilayered ceramic technology and more particularly, to a Bluetooth headset combined with antenna and touch sensor, which integrates a sensing touch member inside a button of the Bluetooth headset with a Bluetooth antenna. The antenna element with touch function increases the density of the earphone component, in addition to the waterproof improvement, and the Bluetooth antenna is set near the external position of the Bluetooth headset, which makes the audio signal transmission effect clearer.

2. Description of the Related Art

The Bluetooth specification widely used in electronic products is a wireless communication protocol jointly developed by IBM, Intel, Nokia, Ericsson and Toshiba. Through the original Bluetooth 1.0 specification, it can only transmit within 10 meters. The Bluetooth 5.0 specification has been able to transmit at 300 meters, and the power consumption is only ½ to ¹⁄₁₀₀ of the initial power. The technology behind Bluetooth has evolved significantly.

Today's Bluetooth technology is used to wirelessly transmit audio signals. The most commonly used electronic products are Bluetooth headsets and Bluetooth speakers, and Bluetooth technology can also be applied to mouse or short-range mobile devices (such as: unmanned aerial camera, remote control toy car). However, the application to short-range mobile devices is still limited by the fact that the remote control distance is not long enough to be fully used. Therefore, Bluetooth technology is most widely used in Bluetooth headphones and earphones. The traditional in-ear Bluetooth earphone, because the Bluetooth antenna is placed inside the earphone body of the earphone, will be caught in the auricle and obscured by the ear canal of the human body, and then its signal receiving effect is more or less weakened. If the in-ear Bluetooth earphone is further obscured by the human hand or the palm or other obstruction, the signal is bound to be further attenuated, resulting in a signal interruption of the call or music signal. How to adjust the matching circuit frequency of the antenna, so that the touch maintains a certain sensitivity and does not generate false touch signals, becomes an extremely important subject.

FIG. 1 is a functional block diagram of a Bluetooth earphone according to the prior art. As illustrated, the Bluetooth earphone has mounted therein a Bluetooth wireless chip 41, a Bluetooth antenna 42, a capacitive touch chip 43, a touch button 44 and a rechargeable lithium battery (not shown). The Bluetooth antenna 42 is a printed antenna or an antenna chip, which occupies a certain volume, making the overall size and weight of the Bluetooth earphone not light. Furthermore, the touch button 44 has a touch copper foil mounted therein to sense the body capacitance value. The touch copper foil also occupies a certain volume inside the touch button 44, which is a fatal injury for a light and short Bluetooth earphone. If the internal components of the Bluetooth earphone cannot be simplified and compact, the Bluetooth earphone shape and manufacturing cost will be limited, which is not conducive to sales competition. The above problems need to be improved in this industry.

SUMMARY OF THE INVENTION

The present invention has been accomplished under the circumstances in view. It is the main object of the present invention to provide a Bluetooth headset combined with antenna and touch sensor, which integrates a sensing touch member inside a button of the Bluetooth headset with a Bluetooth antenna. The antenna element with touch function increases the density of the earphone component, in addition to the waterproof improvement, and the Bluetooth antenna is set near the external position of the Bluetooth headset, which makes the audio signal transmission effect clearer.

It is another object of the present invention to provide a Bluetooth headset combined with antenna and touch sensor, wherein a first touch matching circuit, a second touch matching circuit and a changeover switch are electrically connected between the antenna element and the touch sensing module. When the signal of the antenna element is blocked, the changeover switch automatically switches between the first touch matching circuit and the second touch matching circuit to perform frequency adjustment and selects the better signal of the first or second touch matching circuit to do a circuit matching.

Other advantages and features of the present invention will be fully understood by reference to the following specification in conjunction with the accompanying drawings, in which like reference signs denote like components of structure.

DETAILED DESCRIPTION OF THE PREFERRED EMBODIMENT

Figure 1:
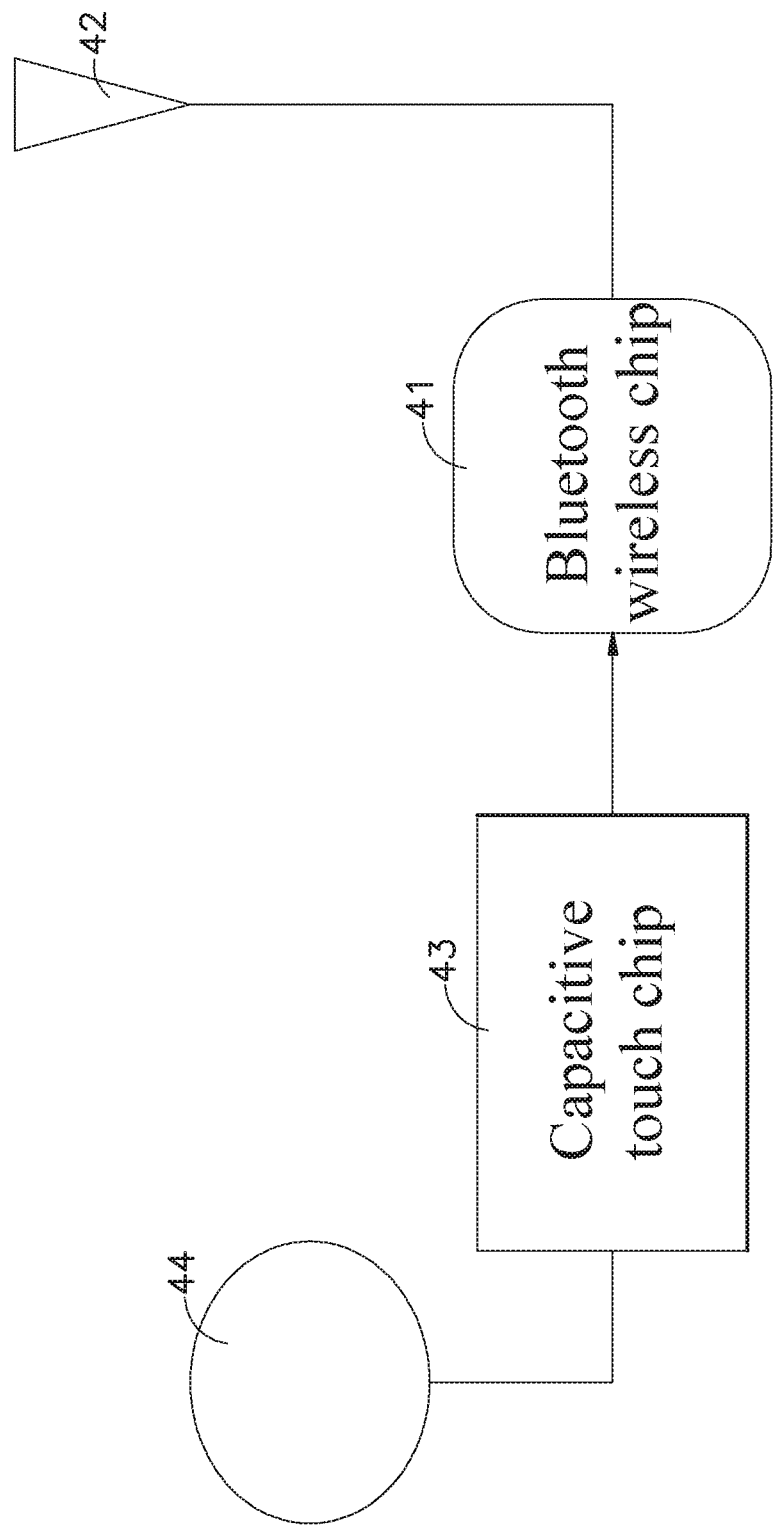
FIG. 1 is a functional block diagram of a Bluetooth headset according to the prior art.
Figure 2:
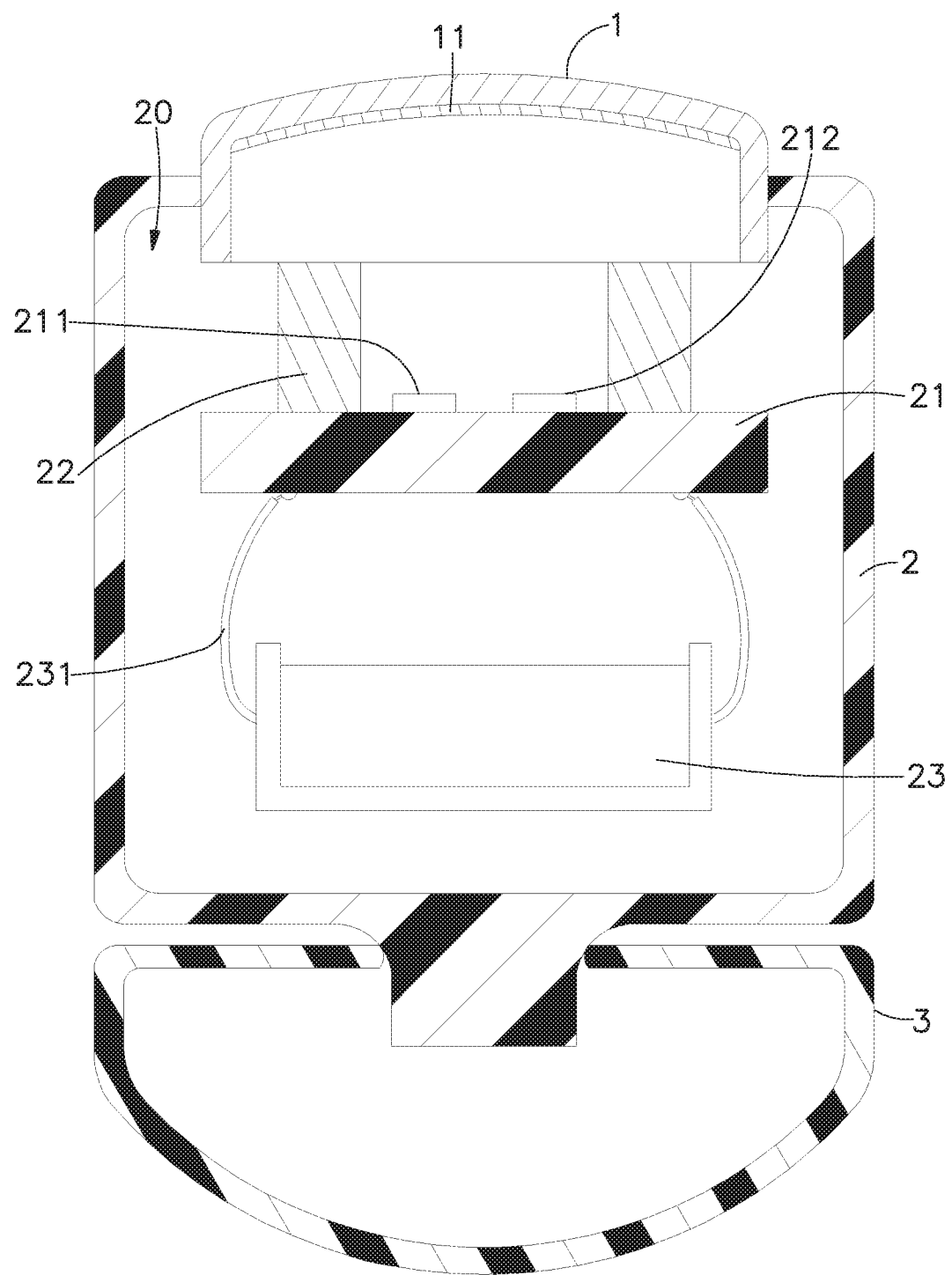
FIG. 2 is a sectional side view of a Bluetooth headset combined with antenna and touch sensor in accordance with the present invention.
Figure 3:
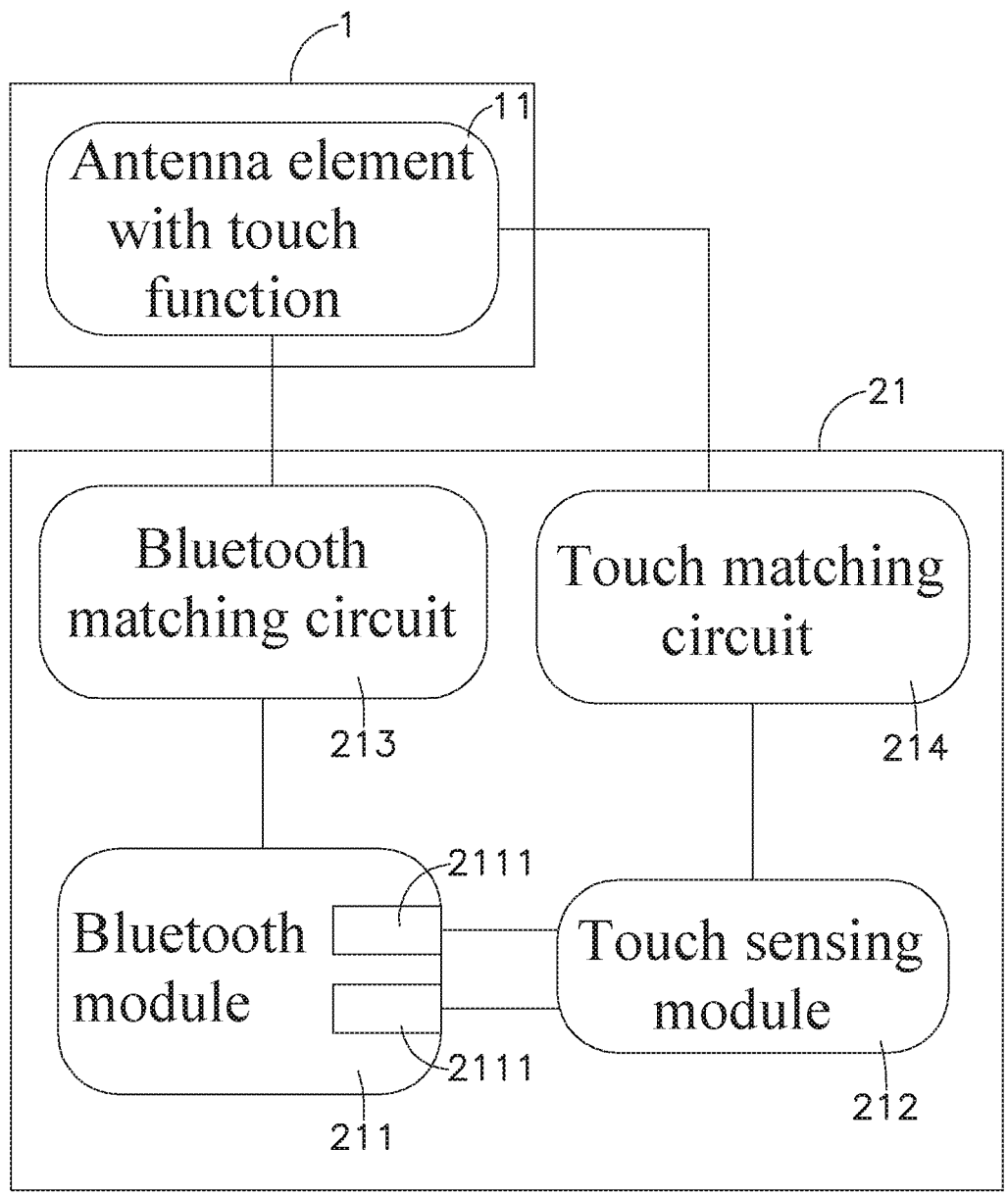
FIG. 3 is a functional block diagram of the Bluetooth headset combined with antenna and touch sensor in accordance with the present invention.
Figure 4:
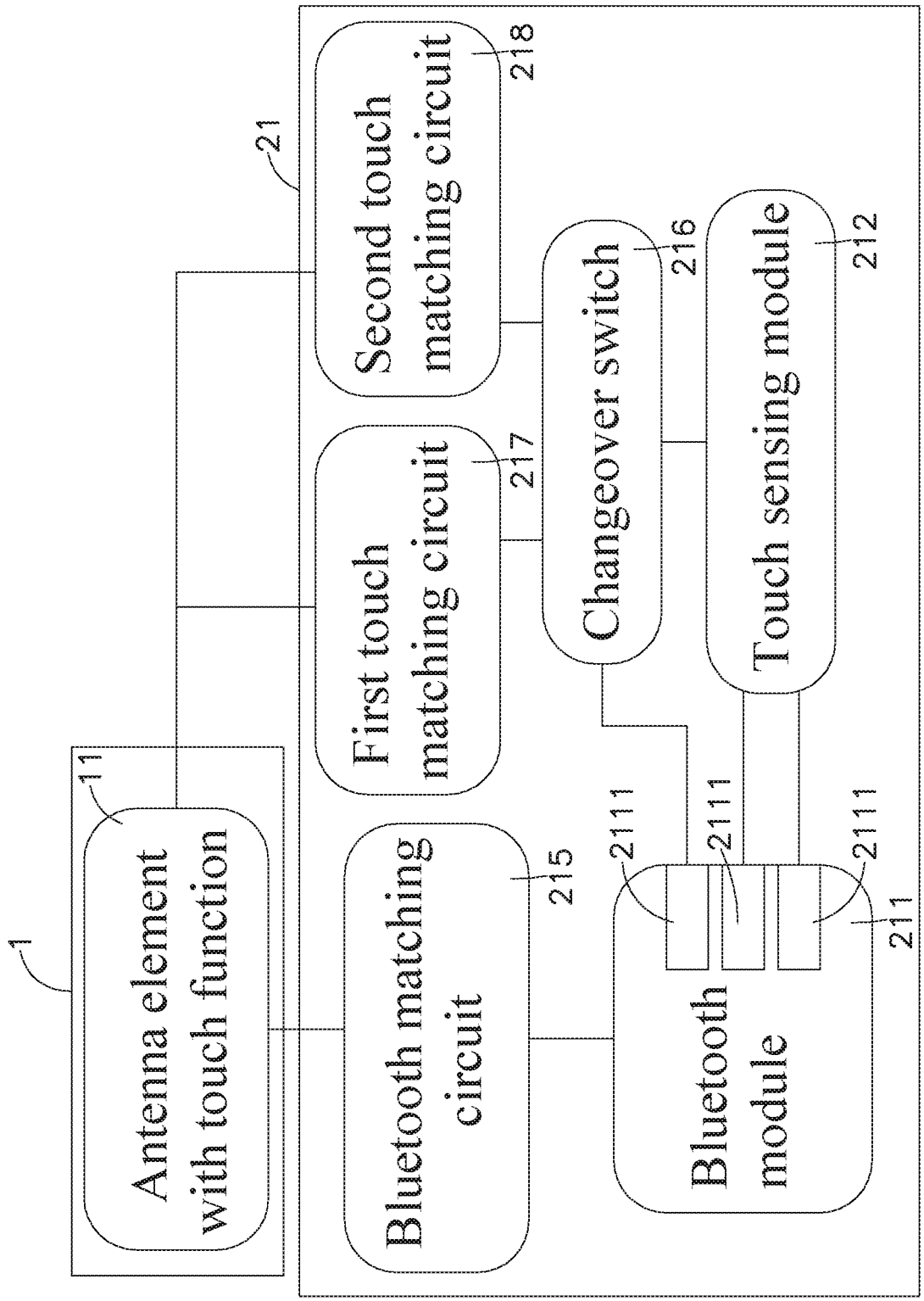
FIG. 4 is a functional block diagram of an alternate form of the Bluetooth headset combined with antenna and touch sensor in accordance with the present invention.

Referring to FIGS. 2-4, a sectional side view of a Bluetooth headset combined with antenna and touch sensor in accordance with the present invention, a functional block diagram of the Bluetooth headset combined with antenna and touch sensor in accordance with the present invention and a functional block diagram of an alternate form of the Bluetooth headset combined with antenna and touch sensor in accordance with the present invention are shown.

The Bluetooth headset combined with antenna and touch sensor comprises an earphone body 2, a button 1 arranged on one end of the earphone body 2, an earphone tip 3 arranged on an opposite end of the earphone body 2.

An antenna element 11 with touch function is disposed inside the button 1 and capable of transmitting and receiving wireless signals and sensing the electrostatic charge of a human body. The antenna element 11 with touch function is composed of a metal foil, and the preferred material is a copper sheet or a copper foil having a Bluetooth antenna signal radiating portion and a Bluetooth antenna signal feeding portion (not shown). At the same time, the antenna element 11 senses the electrostatic charge of a human body.

A Bluetooth module 211 is disposed on a circuit board 21 in a cavity 20 in the earphone body 2 and electrically connected to the antenna element 11, and transmits and receives a Bluetooth signal by using the antenna element 11. An elastic component 22 is disposed between the button 1 and the circuit board 21. The elastic component 22 provides signal transmission between the button 1 and the earphone body 2, so that the human body electrostatic charge signal can be finally received by a touch sensing module 212. The preferred implementation structure of the elastic component 22 is a spring piece or a metal wire capable of providing an elastic recovery force between the button 1 and the earphone body 2.

A Bluetooth matching circuit 213 (or 215) is disposed on the circuit board 21 and electrically connected between the antenna element 11 and the Bluetooth module 211.

The touch sensing module 212 is disposed on the circuit board 21, and is electrically connected to the antenna element 11 and the Bluetooth module 211 to receive the electrostatic charge of the human body sensed by the antenna element 11 and to perform a corresponding function according to the capacitance value of the electrostatic charge of the human body and the duration of the touch.

The touch sensing module 212 reduces false triggering by adjusting the proximity of the capacitance generated by the electrostatic charge of the human body and the duration of the touch.

A signal transmission interface 2111 between the Bluetooth module 211 and the touch sensing module 212 is a general-purpose input/output (GPIO) or an inter-integrated circuit, or both the general-purpose input/output (GPIO) and the inter-integrated circuit.

Referring to FIG. 3, in the first embodiment of the present invention, the Bluetooth headset combined with antenna and touch sensor further comprises a touch matching circuit 214 electrically connected between the antenna element 11 and the touch sensing module 212. This embodiment is applicable to the antenna element 11 with a touch function of a large bandwidth. Since the frequency band of the antenna element 11 with a touch function is sufficiently wide, the touch matching circuit 214 does not need to perform frequency adjustment.

Referring to FIG. 4, in the second embodiment of the present invention, the Bluetooth headset combined with antenna and touch sensor further comprises a changeover switch 216, a first touch matching circuit 217 and a second touch matching circuit 218 disposed between the antenna element 11 and the touch sensing module 212. The changeover switch 216, the first touch matching circuit 217 and the second touch matching circuit 218 are mounted on the circuit board 21. This embodiment is applicable to the antenna element 11 with a touch function of a small bandwidth. When the signal of the antenna element 11 with the touch function is blocked (ear canal or finger), the changeover switch 216 automatically switches between the first touch matching circuit 217 and the second touch matching circuit 218 to perform frequency adjustment, and selects the better signal of the first touch matching circuit 217 or second touch matching circuit 218 to do a circuit matching, so that the touch sensing module 212 obtains the best touch effect.

A power supply device 23 is electrically connected to the circuit board 21 to provide electrical power. The power supply device 23 is composed of a rechargeable lithium battery and is electrically connected with the circuit board 21 by an electrical wire 231 to form a charging and discharging function.

As illustrated in FIGS. 2-4, the present invention provides a Bluetooth headset combined with antenna and touch sensor, which integrates a sensing touch member inside a button of the Bluetooth headset with a Bluetooth antenna. The antenna element with touch function increases the density of the earphone component, in addition to the waterproof improvement, and the Bluetooth antenna is set near the external position of the Bluetooth headset, which makes the audio signal transmission effect clearer. Further, a first touch matching circuit, a second touch matching circuit and a changeover switch are electrically connected between the antenna element and the touch sensing module. When the signal of the antenna element is blocked, the changeover switch automatically switches between the first touch matching circuit and the second touch matching circuit to perform frequency adjustment and selects the better signal of the first or second touch matching circuit to do a circuit matching. The innovative circuit architecture of the Bluetooth headset of the invention helps to reduce the manufacturing cost and obtain better signal transceiving effect, so a patent application is filed to seek patent protection.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A Bluetooth headset, comprising:
   an earphone body;
   a button arranged on one end of said earphone body;
   an earphone tip arranged on an opposite end of said earphone body;
   an antenna element with touch function disposed inside said button and capable of transmitting and receiving wireless signals and sensing the electrostatic charge of a human body;
   a circuit board mounted in a cavity in said earphone body;
   a Bluetooth module disposed on said circuit board and electrically connected to said antenna element for transmitting and receiving a Bluetooth signal through said antenna element;
   a touch sensing module mounted on said circuit board and electrically connected with said antenna element and said Bluetooth module for receiving and sensing the electrostatic charge of the human body and performing a corresponding function according to the capacitance value generated by the human body electrostatic charge and a touch duration; and
   a power supply device electrically connected with said circuit board to provide electrical power.

2. The Bluetooth headset as claimed in claim 1, further comprising a Bluetooth matching circuit electrically connected between said antenna element and said Bluetooth module.

3. The Bluetooth headset as claimed in claim 1, further comprising a touch matching circuit electrically connected between said antenna element and said touch sensing module.

4. The Bluetooth headset as claimed in claim 1, further comprising a changeover switch, a first touch matching circuit and a second touch matching circuit electrically connected between said antenna element and said touch sensing module and so configured that when the signal of said antenna element is blocked, said changeover switch automatically switches between said first touch matching circuit and said second touch matching circuit to perform frequency adjustment, and selects the better signal of said first touch matching circuit or said second touch matching circuit to do a circuit matching, so that said touch sensing module obtains the best touch effect.

5. The Bluetooth headset as claimed in claim 1, further comprising a signal transmission interface between said Bluetooth module and said touch sensing module, said signal transmission interface being selectively a general-purpose input/output (GPIO) or an inter-integrated circuit.

6. The Bluetooth headset as claimed in claim 1, further comprising an elastic component disposed between said button and said circuit board, said elastic component providing signal transmission between said button and said earphone body.

7. The Bluetooth headset as claimed in claim 6, wherein said elastic component is selectively a spring piece or a metal wire.

8. The Bluetooth headset as claimed in claim 1, wherein said antenna element is composed of a metal foil, and the preferred material is a copper sheet or a copper foil.

9. The Bluetooth headset as claimed in claim 1, wherein said antenna element comprises a Bluetooth antenna signal radiating portion and a Bluetooth antenna signal feeding portion and is capable of sensing the electrostatic charge of the human body.

10. The Bluetooth headset as claimed in claim 1, wherein said touch sensing module reduces false triggering by adjusting the proximity of the capacitance generated by the electrostatic charge of the human body and the duration of the touch.

\* \* \* \* \*